US011374685B2

(12) United States Patent
Kourzanov

(10) Patent No.: US 11,374,685 B2
(45) Date of Patent: Jun. 28, 2022

(54) ADDRESS FILTERING IN A RADIO FREQUENCY FRONT END OF A RECEIVER

(71) Applicant: NXP B.V., Eindhoven (NL)

(72) Inventor: Petr Kourzanov, Eindhoven (NL)

(73) Assignee: NXP B.V., Eindhoven (NL)

( * ) Notice: Subject to any disclaimer, the term of this patent is extended or adjusted under 35 U.S.C. 154(b) by 87 days.

(21) Appl. No.: 16/938,476

(22) Filed: Jul. 24, 2020

(65) Prior Publication Data

US 2022/0029739 A1    Jan. 27, 2022

(51) Int. Cl.
| | |
|---|---|
| *H04L 1/00* | (2006.01) |
| *H03M 1/12* | (2006.01) |
| *H04B 1/16* | (2006.01) |
| *H04L 5/00* | (2006.01) |
| *H04L 27/22* | (2006.01) |
| *H04L 61/00* | (2022.01) |
| *H04W 84/12* | (2009.01) |

(52) U.S. Cl.
CPC .......... *H04L 1/0045* (2013.01); *H03M 1/124* (2013.01); *H04B 1/16* (2013.01); *H04L 5/001* (2013.01); *H04L 27/22* (2013.01); *H04L 61/35* (2013.01); *H04W 84/12* (2013.01)

(58) Field of Classification Search
CPC ....... H04L 1/0045; H04L 5/001; H04L 27/22; H04L 61/35; H03M 1/124; H04B 1/16; H04W 84/12
See application file for complete search history.

(56) References Cited

U.S. PATENT DOCUMENTS

| | | | | |
|---|---|---|---|---|
| 5,646,698 | A * | 7/1997 | Yang | H04N 7/0803 348/475 |
| 6,378,073 | B1 * | 4/2002 | Davis | G06Q 20/32 726/1 |
| 6,529,954 | B1 * | 3/2003 | Cookmeyer, II | H04L 41/16 706/47 |
| 9,014,175 | B2 | 4/2015 | Fleming | |
| 9,160,712 | B2 * | 10/2015 | Harper | H04W 12/088 |
| 2006/0193300 | A1 * | 8/2006 | Rawat | H04W 24/00 370/338 |
| 2014/0092731 | A1 | 4/2014 | Gupta | |
| 2018/0063873 | A1 | 3/2018 | Desai et al. | |
| 2019/0385057 | A1 * | 12/2019 | Litichever | H04L 63/1416 |
| 2021/0227583 | A1 * | 7/2021 | Morioka | H04W 84/12 |

FOREIGN PATENT DOCUMENTS

| | | |
|---|---|---|
| EP | 3675444 A1 | 1/2020 |
| WO | 2006028900 A2 | 3/2006 |

\* cited by examiner

*Primary Examiner* — Freshteh N Aghdam

(57) ABSTRACT

A radio frequency (RF) front end receives one or more symbols of a first frame transmitted by a transmitter. The RF front end determines that the one or more received symbols are correlated to one or more address symbols, where the one or more address symbols are each a time-domain signal of subcarriers that the transmitter transmits. The RF front end provides the received one or more symbols to a baseband system based on the correlation. The baseband system recovers bits of a second frame within the first frame based on the received one or more symbols.

20 Claims, 5 Drawing Sheets

US 11,374,685 B2

ADDRESS FILTERING IN A RADIO FREQUENCY FRONT END OF A RECEIVER

FIELD OF USE

This disclosure generally relates to address filtering in a radio frequency (RF) front end of a receiver, and more particularly to filtering frame addresses in the RF front end of the receiver.

BACKGROUND

A wireless system operating in accordance with WiFi based on the Institute of Electrical and Electronics Engineers (IEEE) 802.11 family of standard includes a transmitter and a receiver. The transmitter transmits a frame over an air interface to the receiver. The receiver has a radio frequency (RF) front end and a baseband system to recover bits of the frame which is provided to a host. The host parses the bits of the frame to determine one or more of a source frame address which identifies a source host which transmitted the frame and a destination host which is to receive the frame. If some, or all of the source and destination frame addresses do not match a predetermined addresses, then the host does not process the frame and the frame is dropped.

Figure 1:
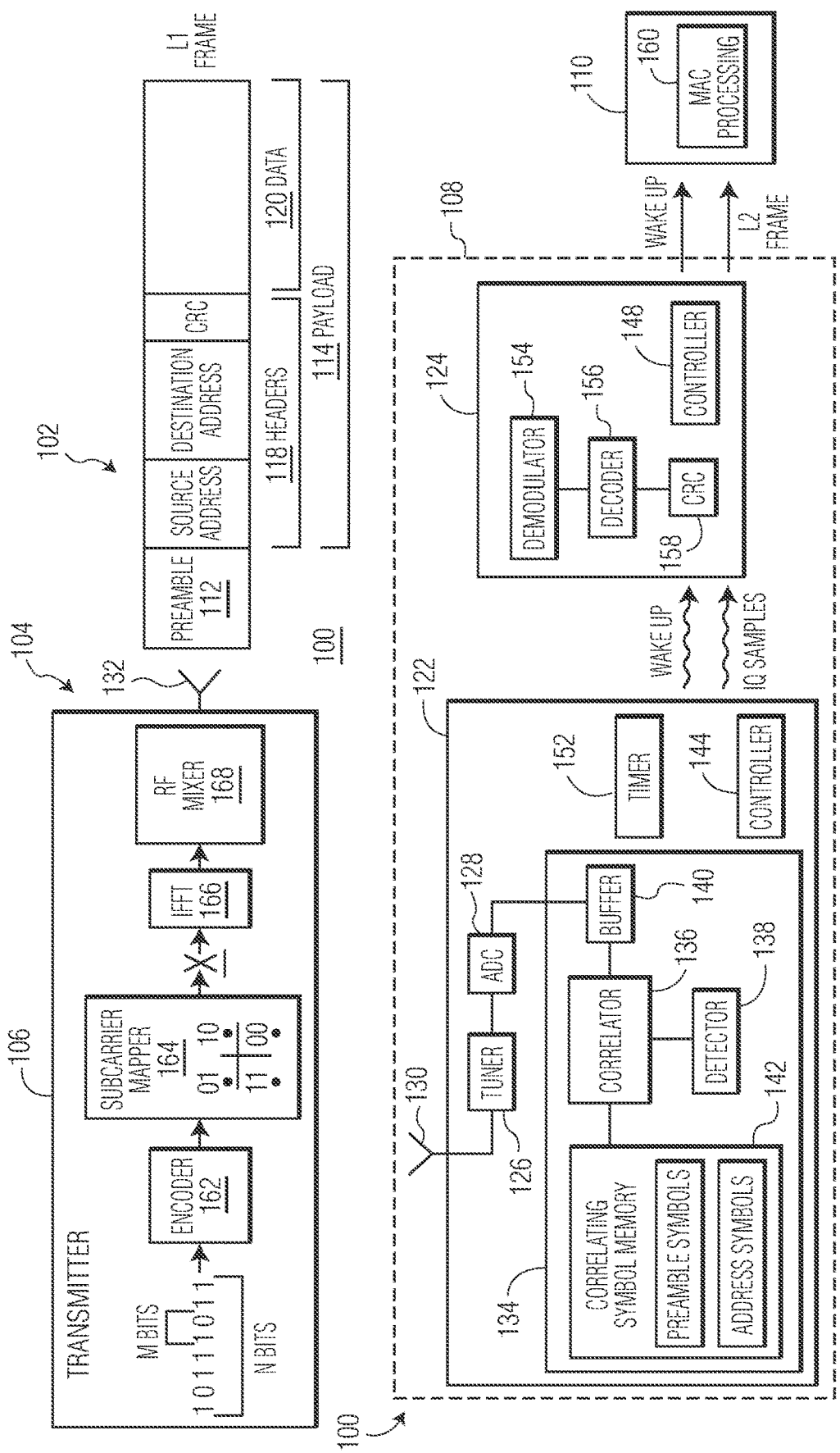
FIG. 1 is an example block diagram of a wireless system having a radio frequency (RF) front end arranged to perform address filtering in accordance with embodiments of the invention.

The drawings are for the purpose of illustrating example embodiments, but it is understood that the embodiments are not limited to the arrangements and instrumentalities shown in the drawings.

DETAILED DESCRIPTION

The description that follows includes example systems, methods, techniques, and program flows associated with address filtering in a radio frequency (RF) front end of a receiver to reduce frame dropping by a host. The address filtering begins with the RF front end receiving an RF modulated carrier wave and recovering a baseband signal of subcarriers. In examples, groups of subcarriers define received orthogonal frequency division multiplexed (OFDM) symbols. The RF front end samples the baseband signal of the subcarriers to generate in-phase and quadrature-phase (IQ) samples of the received symbols. The RF front end determines if a frame defined by the received symbols has a specific source frame address, destination frame address, or combination thereof, referred to as address filtering. The determination is based on a correlation between IQ samples of the received symbols and IQ samples of stored symbols representative of a certain frame address. If the correlation exceeds a threshold, then the frame defined by the received symbols has the specific source frame address and/or destination frame address. The RF front end wakes up a baseband system and provides the IQ samples of the received symbols to the baseband system which in turn provides the bits of the frame to a host for processing. If the correlation does not exceed the threshold, the RF front end does not provide the IQ samples of the received symbols to the baseband system and does not wake up the baseband system. By the RF front end performing the address filtering, the host does not need to make a decision whether to drop the frame. The RF front end already determined that the frame is relevant, unless the host provides further consistency checking and/or additional address-filtering. Further, the baseband system remains asleep or in a low power state to save power and preserve resources associated with processing frames unless the frame is relevant. Well known instructions, protocols, structures, and techniques have not been shown in detail in order not to obfuscate the description.

Example System

FIG. 1 is an example block diagram of a wireless system 100 having a radio frequency (RF) front end arranged to perform address filtering. In examples, the wireless system 100 may operate in accordance with a wireless standard such as WiFi based on the Institute of Electrical and Electronics Engineers (IEEE) 802.11 family of standard and include a transmitter 106 for transmitting a frame 102 and a receiver 108 for receiving the frame 102. In examples the receiver 108 may be further coupled to a host 110 which may be a computer system, a multi-media access point, a cell phone, a (portable) game machine, a Personal Digital Assistant (PDA), a smart phone, an internet of things (JOT) device, or any other type of device that benefits from accessing a wireless network infrastructure. The transmitter 106 may be implemented using circuitry such as analog circuitry, mix signal circuitry, memory circuitry, logic circuitry, processing circuitry arranged to execute code stored in a memory and when executed by the processing circuitry perform the disclosed functions of the transmitter as described herein, or combinations thereof. The receiver 108 may be implemented using circuitry such as analog circuitry, mix signal circuitry, memory circuitry, logic circuitry, processing circuitry arranged to execute code stored in a memory and when executed by the processing circuitry perform the disclosed functions of the receiver as described herein, or combinations thereof. The host 110 may be implemented using circuitry such as analog circuitry, mix signal circuitry, memory circuitry, logic circuitry, processing circuitry arranged to execute code stored in a memory and when executed by the processing circuitry perform the disclosed functions of the host as described herein, or combinations thereof.

The frame 102 may have a plurality of fields. The plurality of fields may be associated with layers of the open systems interconnection (OSI) model which standardizes communication functions between the transmitter 106 and the receiver 108. The frame 102 may be a physical layer frame (L1) with a preamble field 112 and a payload field 114. The preamble field 112 may include one or more bits to facilitate synchronization between the transmitter 106 and the receiver 108 and channel estimation between the transmitter 106 and the receiver 108 over the air interface 104. The payload field 114 may comprise one or more bits and have a header 118 and data 120. In examples, the header 118 and data 120 of the payload field 114 defines a data link layer (L2) frame. The header 118 may indicate a source frame address of the data 120 in the frame 116, a destination frame address of the data 120 in the frame 116, or a combination thereof. The source frame address may identify a source of the data 120 such as a host which transmitted the frame 102 and the destination frame address may identify a host which is to receive frame 102. The header 118 may also include error checking bits such as a cyclic redundancy check (CRC) bits and other bits. The frame 102 may include other fields and other information as well associated with other layers of the OSI model.

The transmitter 106 may perform various signal processing to transmit the one or more bits of the frame 102 to the receiver 108. For the payload 114, the signal processing may include encoding a group of N>1 bits in the payload 114 by an encoder 162, where N=8 in this example. In examples, the one more bits may be encoded by scrambling bits or interleaving bits of the group of bits of the frame in a manner by which the receiver 108 may be able to decode the group of bits by descrambling or deinterleaving the encoded bits to recover the one or more bits before encoding. For instance, both the transmitter 106 and the receiver 108 may have a pseudorandom number generator which is initialized with a same random number seed. The scrambling or interleaving may be based on an output from the pseudorandom number. Because the receiver 108 can generate the same output from its pseudorandom number generator, the receiver 108 may be able to perform a corresponding descrambling or deinterleaving to recover the bits before encoding. For the preamble 112, the signal processing may include grouping N>1 bits of the preamble but not encoding the bits.

The signal processing may also include a subcarrier mapper 164 mapping each of M bits of the group of N bits to a respective modulation constellation point in a constellation map, where M<N, and M=2 in this example. The modulation constellation point defines a unique subcarrier for each possible combination of M>1 bits which results in a modulation of the M bits on a subcarrier. In examples, a modulation may be based on one of binary phase shift keying (BPSK), quadrature phase shift keying (QPSK), or quadrature modulation (QAM) and the subcarriers may be sinusoids orthogonal to each other in accordance with orthogonal frequency division multiplexing (OFDM). For example, each subcarrier in the constellation map may be spaced apart by 312.5 kHz. The subcarrier mapper 164 may output a complex number that defines a corresponding constellation point to which M bits are mapped and in examples represents a magnitude and phase of a subcarrier in a frequency domain. The subcarrier mapper 164 may output a vector X of complex numbers associated with each of the M bits of the group of N bits and the transmitter 106 may then apply an inverse Fourier transform (IFFT) 166 to one or more of the complex numbers. The IFFT 166 may output a baseband signal of the subcarriers. The baseband signal may have an in-phase component and a quadrature component (orthogonal to each other) which both vary over time. An OFDM symbol may be a time domain signal which comprises the subcarriers of the group of N bits. In some examples, the OFDM symbol may be defined by 48 subcarriers which represent N=24 bits to N=216 bits of the frame 102 depending on the modulation format. Further, the frame may be transmitted as one or more OFDM symbols.

The transmitter 106 transmits a radio frequency (RF) carrier wave mixed by an analog representation of the baseband signal of the subcarriers to produce a modulated RF carrier wave. In examples, the RF carrier wave may have a carrier frequency and a transmit antenna 132 may transmit the modulated RF carrier wave over the air interface 104 to the receiver 108. By an RF mixer 168, the transmitter 106 may mix (multiply) the baseband signal with the RF carrier wave. In examples, the RF carrier wave may be composed of an in-phase RF carrier wave and a quadrature RF carrier wave which are out of phase with each other by 90°. The mixer 168 may mix the in-phase component of the baseband signal with the in-phase RF carrier wave. Further, the transmitter 106 may mix the quadrature component of the baseband signal with the quadrature-phase RF carrier wave. The transmitter 106 may then sum the mixed signals and transmit the modulated RF carrier wave. To facilitate this transmission, the transmitter 106 may have one or more mixers and one or more local oscillators. The local oscillators may generate the RF carrier wave and the mixer may mix the baseband signal onto the carrier wave. In examples, the local oscillator oscillates at a frequency such as 5.8 GHz to 10 GHz.

The receiver 108 may be arranged with a radio frequency (RF) front end 122 and a baseband system 124 to receive the frame 102 transmitted by the transmitter 106 over the air interface 104. The RF front end 122 may include a tuner 126 and an analog to digital converter (ADC) 128. The tuner 126 is coupled to a receive antenna 130 to receive and mix an RF carrier wave with the RF modulated carrier wave to recover the baseband signal of the subcarriers. The tuner 126 may have one or more local oscillators and mixers to perform this mixing. For example, the RF front end may have a local oscillator which generates an RF carrier wave. The modulated RF carrier wave is mixed with an in-phase RF carrier wave to generate an in-phase signal. Additionally, the modulated RF carrier wave is mixed with a quadrature RF carrier wave to generate a quadrature-phase signal. The in-phase signal and quadrature signals may define a baseband signal of the subcarriers. The analog to digital converter (ADC) 128 may sample the in-phase signal and the quadrature-phase signal to produce IQ samples of the received symbols. The I sample may correspond to a sample of the in-phase signal, the Q sample may correspond to a sample of the quadrature phase signal, and the I sample is in quadrature to the Q sample. The IQ samples received over time may define the one or more received symbols.

The RF front end may have an acquisition block 134 to detect whether the received symbols are associated with a preamble of a frame. A buffer 140 of the acquisition block 134 may store the received symbols which in some examples takes the form of a first in first out (FIFO) buffer. Then, a correlator 136 may determine a correlation based on the received symbols and a detector 138 may provide an indication of whether the received symbols are associated with a preamble of a frame.

In one example, the buffer 140 may provide the received symbols to the correlator 136 and the correlator 136 may perform an autocorrelation of the received symbols. Autocorrelation is a correlation of data with a delayed copy of the data as a function of delay. The correlator 136 may include a complex multiplier and an accumulator to perform the autocorrelation. The correlator 136 may perform the correlation based on a depth which may be a number of IQ samples of the received symbols which are correlated at one time. For example, with a depth of 16, the correlator may correlate 16 IQ samples of the received symbols at a time. As another example, with a depth of 64 bytes, the correlator 136 may correlate 64 IQ samples of the received symbols at a time. As yet another example, the depth of the correlator may be configurable to correlate a variable number of IQ samples of the received symbols at a time. The detector 138 may receive results of the correlation and determine whether the result of the correlation exceeds a threshold amount. The preamble field 112 of the frame 102 may have a pattern of bits which translates to a pattern of IQ samples. If the result of the correlation exceed a threshold amount, then the received symbols may be associated with a preamble. Controller 144 in the RF front end 122 may establish one or more of frequency, time synchronization, or channel estimation with the transmitter 106 based on the preamble to facilitate receiving additional symbols associated with the payload field 114 of the frame 102. If the result of the correlation does not exceed a threshold amount, then the received symbols may not be associated with the preamble.

In another example, the correlator 136 may perform a cross correlation of the received symbols with preamble symbols indicative of the preamble. The cross correlation is a measure of similarity of two series as a function of the series. The preamble symbols may be derived from signal processing that the transmitter 106 would perform to transmit the symbols of the preamble 112. In examples, the signal processing may include one or more of modulation of subcarriers by preamble bits in the preamble field 112, IFFT, and ADC sampling to form IQ samples of preamble symbols. In examples the acquisition block 134 may further have a correlating symbol memory 142 which stores the IQ samples of the preamble symbols. The correlator 136 may include a complex multiplier and an accumulator to perform a correlation (e.g., cross correlation) between the IQ samples of the preamble symbols and the IQ samples of the received symbols. In examples, the cross correlation function may be represented as:

$$z_i = \left| \sum_{k=0}^{N-1} x^*_{k+1} y_{i+k} \right|^2$$

where "x" and "y" are inputs to the cross correlation function. "y" may be a vector of the IQ samples of one or more received symbols and "x" may be a vector of IQ samples of one or more preamble symbols. In this regard, the IQ samples are represented as complex numbers with I being a real component and Q being a complex component, "x" and "y" are vectors of complex numbers and * indicates a conjugate operation. A higher z indicates a better correlation while a lower z indicates a worse correlation. In examples, "i" defines an index in an output vector of cross-correlation values z.

The detector 138 may receive results of the correlation and determine whether the result of the correlation exceeds a threshold amount. If the result of the correlation exceed a threshold amount, then the received symbols are associated with a preamble. The controller in the RF front end 122 may establish one or more of frequency and time synchronization or channel estimation with the transmitter 106 based on the preamble to facilitate receiving additional symbols associated with the payload field 114 of the frame 102. If the result of the correlation does not exceed a threshold amount, then the received symbols are not associated with a preamble and detection of the preamble continues.

Various embodiments described herein are directed to the RF front end 122 performing an address filtering to determine whether the received symbols specify a certain source frame addresses and/or destination frame addresses of an L2 frame. The host 110 may process the payload, i.e., L2 frame, with a certain source frame address, destination frame address, or combination thereof ("relevant frame"). If the received symbols specify the certain source frame addresses and/or destination frame addresses of an L2 frame, then the IQ samples of the receives symbols are provided to the baseband system 124 to recover bits of the frame which is then provided to the host 110. If received symbols does not have the specific source frame address and/or destination frame address, then the IQ samples are not provided to the baseband system 124 to recover bits of the frame. In examples, the host 110 does not need to make a decision whether to drop the frame which does not have a certain source frame address or destination frame because the RF front end already determined that the frame is relevant. Further, the baseband system remains asleep or in a low power state to save power and the host and baseband system preserve resources associated with processing frames which are not relevant.

The correlating symbol memory 142 may store IQ samples of one or more address symbols that defines a certain frame address such as a source frame address, destination frame address, or combination thereof. IQ samples of the address symbols may be derived from the signal processing performed by the transmitter 106 if it was to transmit the symbols of the certain frame address in the frame 102. In examples, the signal processing may include one or more of encoding a group of N bits associated with the address in the frame 102, mapping each of M bits of the N bits to a respective modulation constellation point in a constellation map, and performing an IFFT to output a baseband signal of subcarriers. The in-phase component and a quadrature component of the baseband signal each comprise digital samples, referred to collectively as the IQ samples, and the one or more IQ samples for a group of M bits may define a respective address symbol associated with a modulation format used by the transmitter 132. The correlator 136 may receive the address symbol from the correlating symbol memory 142 and the buffer 140 may provide the received symbols to the correlator 136. The correlator 136 may perform a correlation in a manner similar to how the correlation was performed for the preamble symbols but now with the IQ samples of one or more address symbols and the IQ samples of one or more received symbols. In the correlation equation above, "y" may be the IQ samples of one or more received symbols and "x" may be the IQ samples of one or more address symbols.

The detector 138 which performs address filtering may receive results of the correlation and determine whether the result of the correlation exceeds a threshold amount. In examples, the correlator 136 may be the same correlator which was used to detect the preamble. In other examples, the RF front end 122 may have another correlator to perform this correlation. If the results of the correlation between the IQ samples of the received symbols and the IQ samples of the address symbols does not exceed a threshold amount, then the baseband system 124 which would otherwise process the IQ samples of the received symbols does not need to process the IQ samples of the received symbols. The frame 102 does not have an relevant L2 frame with the certain source frame addresses and/or destination frame addresses. The RF front end 108 may not provide an indication to the baseband system 124 to wake the baseband system 124 from the sleep or low power state to an awake state or higher power state. The baseband system 124 may remain asleep or conserve processing resources. If the result of the correlation between the IQ samples of the received symbols and the IQ samples of the address symbols exceeds a threshold amount, then the baseband system 124 may process the IQ samples of the received symbols. The frame 102 has a relevant L2 frame with the certain source frame addresses and/or destination frame addresses. The RF front end 108 may provide an indication to the baseband system 124 to awaken the baseband system 124 from the low power or the sleep state to an awake state or higher power state to process the received symbols. In examples, a controller 144 of the RF front end 122 may provide the indication to a controller 148 of the baseband system 124 to cause the controller 148 to awaken the baseband system 124.

In some examples, the detector 138 may further cross check the correlation with a timer value of a timer 152 before providing an indication to awaken the baseband system 124. The received symbols associated with the source and/or destination frame address of the frame 102 may be located at a fixed time offset after a symbol of the preamble is received. The acquisition block 134 may start the timer 152 when a symbol associated with the preamble is received and measure a time offset after the symbol associated with the address of the frame 102 is received, indicated by the timer value. If the timer value of the timer 152 matches the fixed time offset and the correlation between the received symbols at that time and the address symbols exceeds a threshold amount, then the RF front end 108 may provide an indication to awaken the baseband system 124. Otherwise, the RF front end 108 might not provide an indication to awaken the baseband system 124. In this regard, the timer value matching the fixed offset time provides an additional confirmation that symbols of the frame 102 define the source address and/or destination address.

A baseband system 124 may wake up based on the indication provided by the RF front end 108 to perform further processing. The baseband system 124 may receive the IQ samples of the received symbols. The baseband system 124 may be arranged with a demodulator 154, decoder 156, and error checking 158. For each received symbol, the demodulator 154 may perform a Fourier transform of the respective IQ samples and mapping identified subcarriers to coded bits based on the constellation used by the transmitter 106. The decoder 156 may perform a descrambling or deinterleaving of the coded bits corresponding to the scrambling or interleaving performed by the transmitter 106 and the error checking 158 may perform a cyclic redundancy check (CRC) on the decoded bits based on CRC bits in the CRC field of frame 102. If the decoded bits have no errors, then the bits associated with one or more symbols may define an L2 frame. In examples, the baseband system 124 may provide an indication to awaken the host 110 from a low power or sleep state and process the L2 frame. In examples, a media access control (MAC) layer 160 of the host 110 may process the L2 frame. The MAC layer 160 controls how devices in a network gain access to a medium and permission to transmit data. Because the RF front end 122 determined that the L2 frame is a relevant frame to be processed by the host 102 (i.e., has a certain source frame address and/or destination frame address), the host 110 does not need to determine whether the L2 frame from the baseband system 124 is relevant frame. Further, the host 110 does not need to make a decision whether to drop the L2 frame because the RF front end already determined the L2 frame is relevant frame. In this regard, the host 110 saves power and preserve resources associated with processing frames.

The RF front end 122 uses the address symbol stored in the correlating symbol memory 142 to perform address filtering. If the correlation indicates detection of a frame address, then the detector 138 causes the baseband system 124 to process the IQ samples of the received symbols, otherwise the detector 138 does not cause the baseband system 124 to process the received symbols. The RF front end 122 may perform alternative processing. For instance, if the correlation indicates detection of a frame address, then the detector 138 does not cause IQ samples of the received symbols to be provided to the baseband system 124. If the correlation indicates does not detection of a frame address, then the detector 138 causes IQ samples of the received symbols to be provided to the baseband system 124. Other variations are also possible.

In some examples, the received symbols may also be correlated with symbols which represents data in other fields in the frame 102. For instance, symbols associated with a logical link control (LLC) layer of the OSI model or symbols associated with a networking layer of the OSI model may be correlated with the received symbols The correlating symbol memory 142 may store IQ samples of symbols that represents fixed bits of the frame associated with one or more of these layers derived from the signal processing performed by the transmitter 106 if it was to transmit the fixed bits in the layer. So that these symbol represents fixed bits in the layer and fewer variable bits associated with the layer, the transmitter 106 may use a modulation format which produces symbols associated with fewer bytes. For example, 1/2BPSK subcarrier modulation may be used to define symbols which has a granularity of 3 bytes per symbol so that a symbol defines few bytes of data with more fixed bits in accordance with the fixed bits of the layer. The "1/2" may indicate a code rate where 1 redundant bit is added for every single bit in this example. The detector 138 may wake up the baseband system 124 based on this correlation in addition to or instead of the correlation with the address symbols described above.

Figure 2:
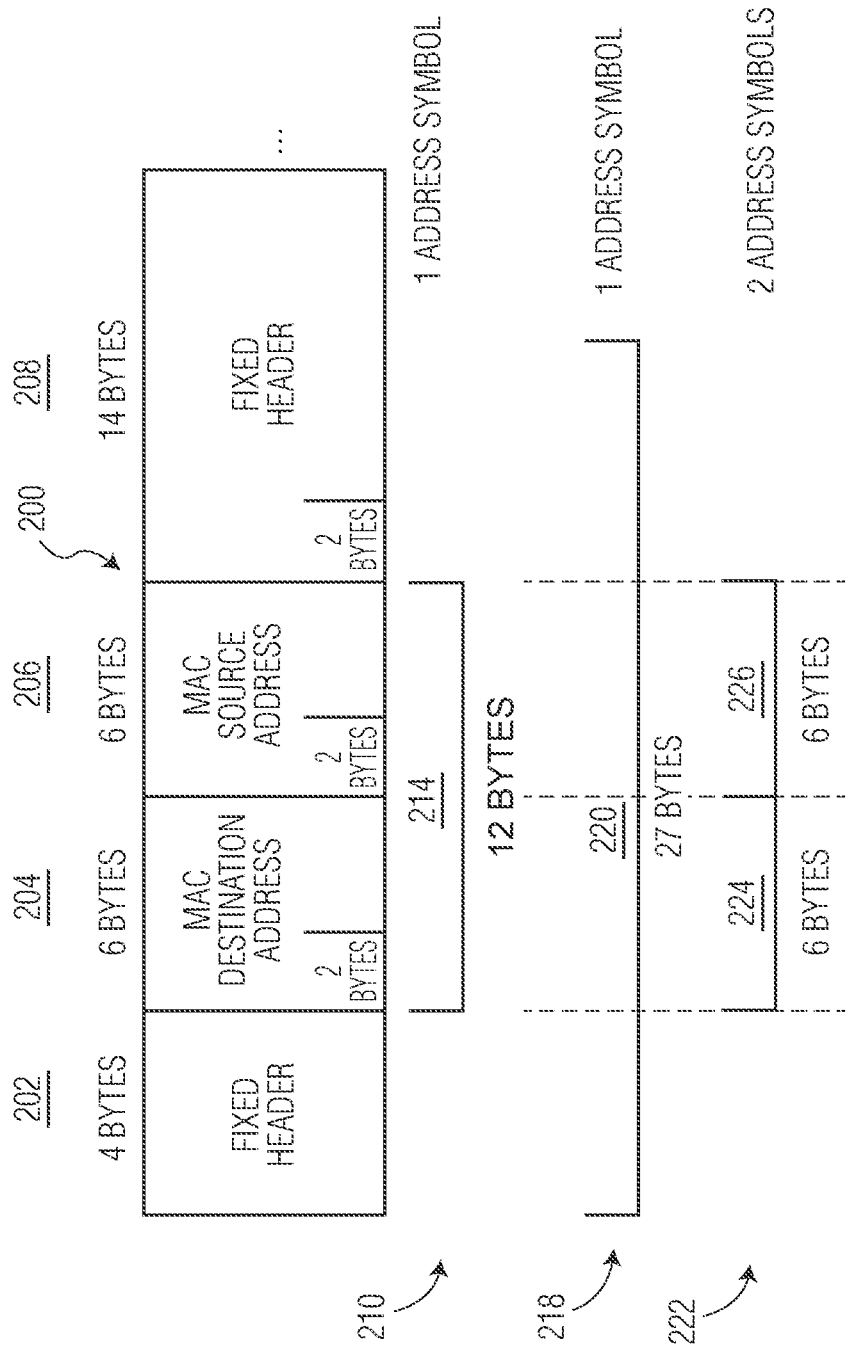
FIG. 2 illustrates various examples of a correlation performed by a correlator between received symbols and address symbols associated with a WiFi frame in accordance with embodiments of the invention.

FIG. 2 illustrates various examples of correlation between the received symbols and address symbols associated with a WiFi frame 200. In examples, the WiFi frame 200 may be a payload 114 of the frame 102 and define fields associated the data link layer. The WiFi frame 200 may be a data link layer (L2) frame. In examples, the correlator 136 may perform the correlation. The example WiFi frame 200 may have a plurality of fields including four bytes of fixed header information 202, 6 bytes of a MAC destination address 204, 6 bytes of a MAC source address 206, 14 bytes of fixed header information 208, and data (not shown). The fixed header information 202, 208 may be known bits for a certain source address and destination address in the WiFi frame 200. The WiFi frame 200 may be transmitted as one or more symbols and a modulation format may define a size of the symbol.

In a first example 210, if the modulation format is 1/2QAM16, the transmitter 106 may transmit a symbol which is 12 bytes and the source and destination address may be transmitted together as 1 symbol. The correlating symbol memory 142 may store the address symbol 214 indicative of a certain source address and destination address of the WiFi frame 200. In some examples, a source address may identify a host and a destination address may comprises fixed bytes (ff:ff:ff:ff:ff:ff). The fixed bytes may indicate safety messages (e.g., accidents, traffic congestion) broadcast by a vehicle to other vehicles in an area when the receiver 108 is associated with vehicular network. The correlator 136 may correlate the address symbol with a corresponding one or more of the received symbols. The detector 138 may compare the correlation to a threshold and if they all exceed a threshold then the frame 200 has the certain source address and destination address. Other variations are also possible.

In a second example 218, if the modulation format is 3/4QAM64, then the transmitter 106 may transmit a symbol which is 27 bytes and the source and destination address may be transmitted as 1 symbol. The address symbol 220 transmitted by the transmitter 106 may include 15 bytes of the fixed information and the 12 bytes associated with the source address and destination address. The frame symbol memory may store the address symbol 220 indicative of a symbol transmitted by the transmitter for a certain source address and destination address of the WiFi frame 200. The correlator 136 may then correlate the address symbol with a corresponding received symbol. The detector 138 may compare results of the correlation to a threshold to determine whether the frame has the certain source address and destination address.

In a third example 222, the transmitter 106 may transmit a symbol which defines only bytes of an address without any other fixed information. If the modulation format is 1/2QPSK, the transmitter 106 may transmit a symbol which is 6 bytes and the source and destination address may be transmitted as 2 symbols. A first address symbol 224 may have 6 bytes of the destination address of the WiFi frame 200 and a second address symbol 226 may have 6 bytes of a source address of the WiFi frame 200. The frame symbol memory may store the address symbols indicative of symbols transmitted by the transmitter for a certain source address and destination address in the WiFi frame 200. The correlator 136 may then correlate the address symbols with corresponding received symbols depending on the depth of the correlator. For instance, if a depth of a correlator is 2 symbols, then the correlator 136 may correlate 2 consecutive received symbols with the address symbols. Results of the correlation may be compared to a threshold to determine whether the frame has the certain source address and destination address. As another example, if a depth of a correlator is 1 symbol, then the correlator 136 may correlate each of the address symbols with a respective received symbol. The detector 138 may compare results of the correlation to a threshold to determine whether the frame 200 has the certain source address and destination address.

In examples, the host 110 may process L2 frames with a specific source and destination frame address which varies over time. In this regard, the address symbols which is correlated to the received symbols may need to be updated to detect the L2 frame which the host 110 processes.

Figure 3:
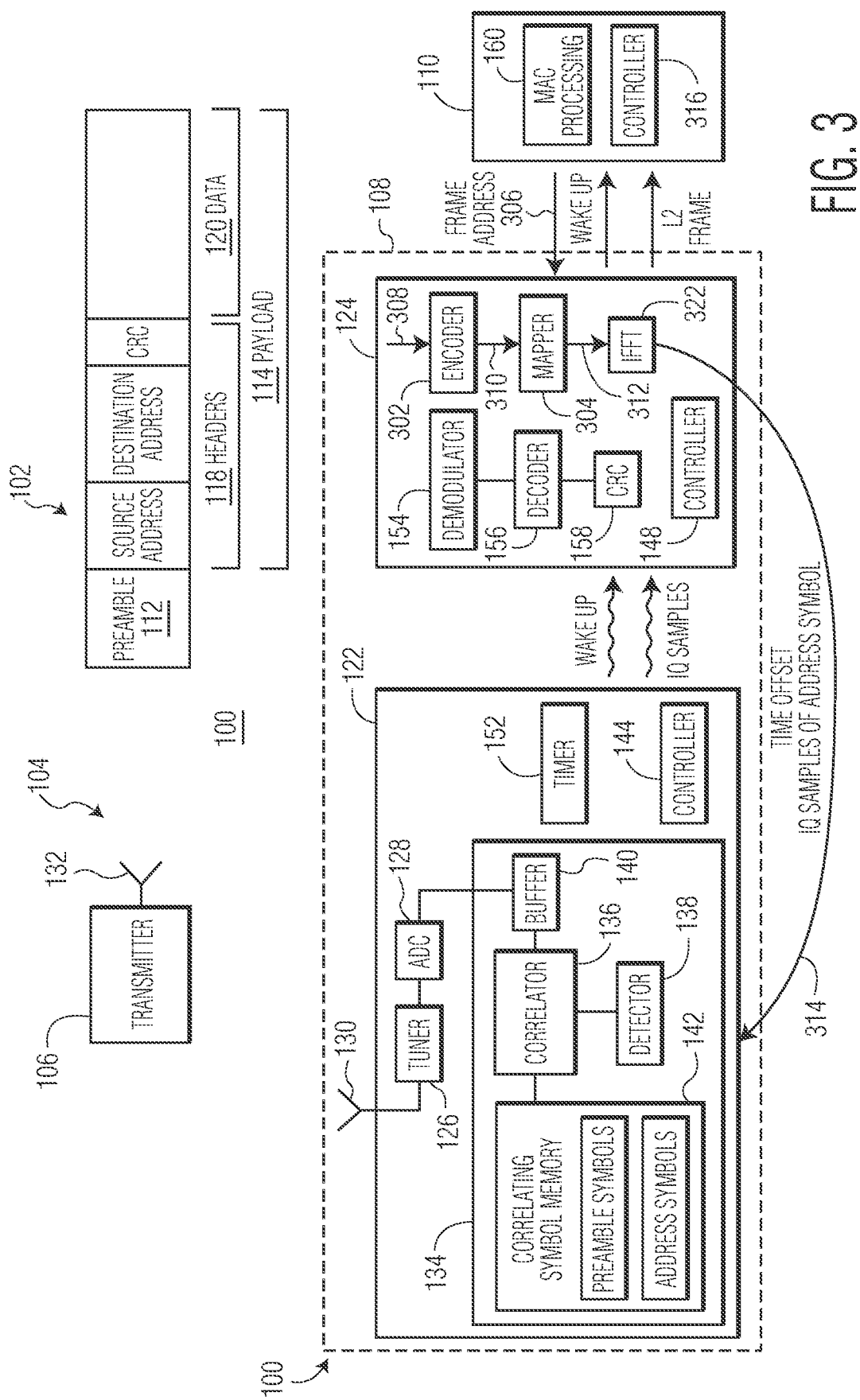
FIG. 3 is an example block diagram of the wireless system arranged to facilitate an address update associated with the address filtering in accordance with embodiments of the invention.

FIG. 3 is an example block diagram 300 of the wireless system 100 arranged to facilitate an update of an address associated with the address filtering. The transmitter 104, receiver 108, and the host 110 may perform functions in a manner similar to that described in relation to FIG. 1 and are not described again for conciseness. In examples, the baseband system 124 is further shown to have an encoder 302, a mapper 304, and an inverse Fourier transform (IFFT) 322. The encoder 302 may be arranged to encode groups of N bits of the frame in a manner similar to how the transmitter 106 encodes groups of N bits of the frame 102. The mapper 304 may be arranged to map each M bits of the N bits to a respective modulation constellation point in a constellation map, where M<N. Each constellation point may be associated with a subcarrier and represents a complex number. Steps 306-314 are example operations associated with the update of the address associated with the address filtering.

At step 306, the host 110 provides an indication of a frame address, such as a source frame address and/or destination frame address, associated with L2 frames which the host 110 is to process to the baseband system 124. The indication of the frame address by the host 110 may be used to facilitate update of IQ samples of address symbols associated with address filtering. In examples, a controller 316 of the host 110 may provide the indication of the frame address to the controller 148 of the baseband system 124. Then, the controller 148 of the baseband system 124 may provide the indication of the frame address to the encoder 302.

At step 308, the encoder 302 of the baseband system 124 receives the indication of the source frame address and/or destination frame address. The indication may be one or more bits. The encoder 302 may be arranged to encode groups of M bits by scrambling or interleaving in a manner similar to how the transmitter 106 encodes bits of the frame 102 with the source frame address and/or destination frame address. In examples, the encoder 302 may encode bits of the source frame address and/or destination frame address with other fixed bits in the frame 102.

At step 310, the mapper 304 receives each group of M encoded bits from the encoder 302. The mapper 304 may map each of N bits in each group of M bits to a respective modulation constellation point in a constellation map. Each constellation point may be associated with a subcarrier. A complex number may represent each modulation constellation point as a magnitude and phase of the subcarrier and the constellation map may be the same as what the transmitter 106 uses to transmit the frame 102. In examples, the N bits is modulated on the subcarrier based on the mapping.

At step 312, an inverse Fourier transform (IFFT) 322 receives an indication of the complex numbers associated with each group of M bits and generates a baseband signal of the subcarriers. The baseband signal may have an in-phase component and a quadrature component (orthogonal to each other) which both vary over time. The in-phase component and a quadrature component each comprise digital samples, referred to collectively as the IQ samples, and the one or more IQ samples for a group of M bits may define a respective address symbol associated with a modulation format used by the transmitter 132. This process is repeated to produce a respective address symbol associated with each group of M bits.

At step 314, the baseband system 124 provides the IQ samples of the one or more address symbols to the RF front end 122. In examples, the RF front end 122 stores the one or more address symbols in the correlation symbol memory 142 as updated address symbols to facilitate correlation of the received symbols with the updated address symbols. Then, as the receiver 102 receives symbols, the correlator 136 may then correlate the updated address symbol with the received symbols and the detector 138 may detect whether the frame 102 has the frame address represented by the updated address symbols. In some examples, the baseband system 124 may also provide an indication of a time offset between a preamble symbol and an address symbol. The detector 138 may use the time offset to also identify whether a received symbol is associated with an address symbol.

Example Operations

Figure 4:
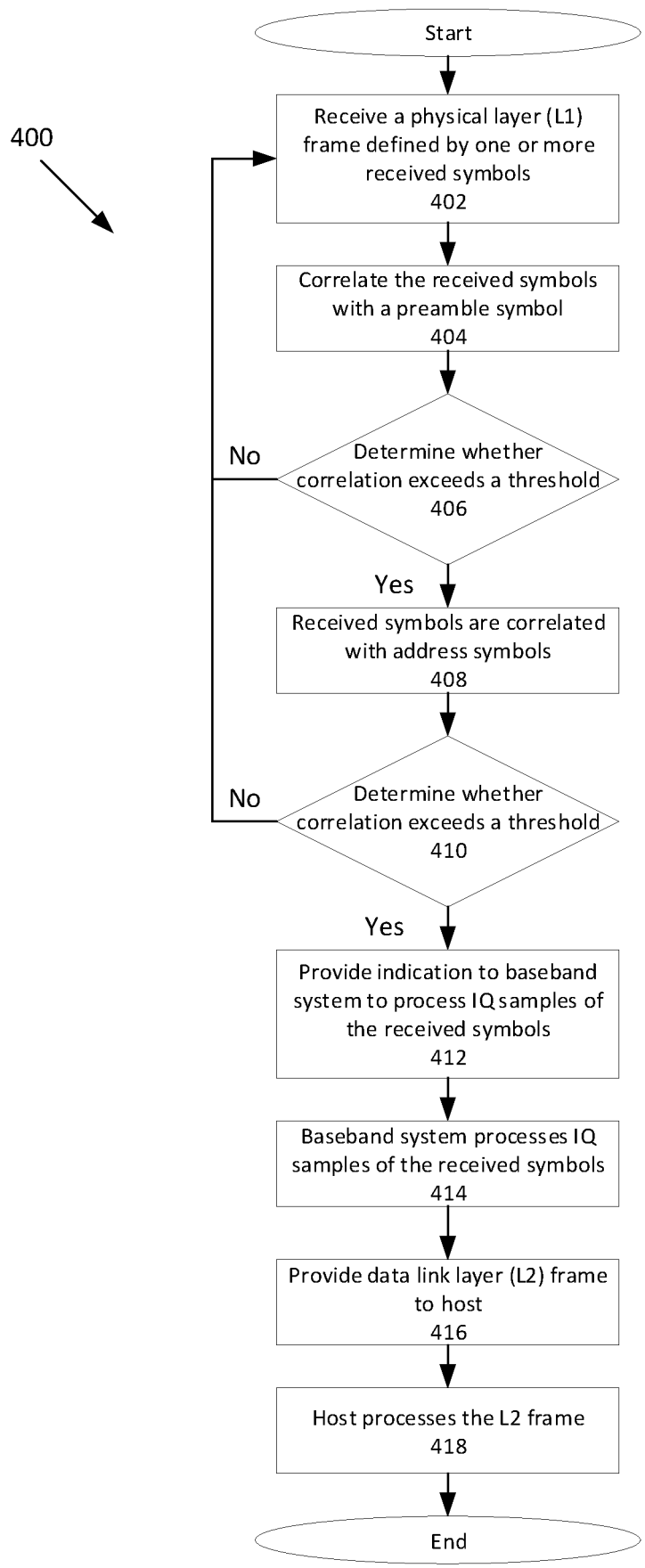
FIG. 4 is an example flow chart of functions associated with address filtering by the RF front end in accordance with embodiments of the invention.

FIG. 4 is an example flow chart of functions 400 associated with address filtering by the RF front end. The RF front end 122 may determine whether a received frame has a certain source frame address or destination frame address and then provide an indication to the baseband system 124 to process IQ samples of received symbols based on the determination. A function may be performed by one or more of the RF front end 122, baseband system 124, or host 110 and be implemented in one or more of analog circuitry, mix signal circuitry, memory circuitry, logic circuitry, processing circuitry arranged to execute code stored in a memory and when executed by the processing circuitry perform the disclosed function, or combinations thereof.

At step 402, the RF front end receives a physical layer (L1) frame defined by one or more received symbols. The L1 frame may include fields of the physical layer. In examples, the radio frequency front end receives a modulated RF carrier wave that defines the L1 frame and mixes the RF modulated carrier wave with an RF carrier wave to recover a baseband signal of subcarriers followed by sampling the baseband signal of subcarriers to output in-phase and quadrature-phase (IQ) samples of the received symbols.

At step 404, the received symbols are correlated with a preamble symbol that represents the preamble of the L1 frame derived from the signal processing performed by the transmitter 106 to transmit the frame 102. The correlator 136 may detect whether IQ samples of the received symbols are correlated with the IQ samples of a preamble symbol. The correlator 136 may receive as an input the IQ samples of the received symbols. The correlator 136 may also receive as an input IQ samples of the preamble symbol.

At step 406, a determination is made whether the correlation at 404 exceeds a threshold. If the correlation exceeds a threshold, then the detector 138 detects a preamble of a frame 116 and processing continues to 408. Otherwise, a frame is not detected and processing returns to 402.

At step 408, the received symbols are correlated with address symbols. The address may represent a certain frame address such as a source frame address, destination frame address, or combination thereof derived from the signal processing performed by the transmitter 106 to transmit the certain frame address. The correlator 136 may detect whether IQ samples of the received symbols are correlated with IQ samples of one or more address symbols which define a certain frame address such as a source frame address, destination frame address, or combination associated with the address filtering. The correlator 136 may receive as an input IQ samples of one or more of the received symbols and IQ samples of one or more address symbol.

At step 410, a determination is made whether the correlation at 408 exceeds a threshold. If the correlation exceeds a threshold, then the detector 138 detects the certain source and/or destination frame address in a frame and processing continues to 412 as relevant frame Otherwise, the frame is not relevant and processing returns to 402. In some examples, the detector 138 may further cross check the correlation with a timer value of a timer 152. The detector 138 may start the timer 152 when a preamble symbol was detected. If the timer reaches the timer value and the correlation at 408 meets the threshold, then the detector 138 may determine that the received symbols is associated with address symbols.

At step 412, an indication is provided to a baseband system 124 to process the IQ samples of the received symbols. Further, the indication may wake up the baseband system 124 from a sleep state.

At step 414, the baseband system 124 receives the IQ samples of the received symbols and based on the indication perform further processing on the IQ samples of the received symbols. The baseband system 124 may have a demodulator 154, decoder 156, and error checking 158 to recover bits of an L2 frame to be provided to the host 110.

At step 416, the baseband system provides the L2 frame to the host 110. The L2 frame may be the payload of the L1 frame associated with the data link layer. In examples, the baseband system may also wake up the host 110 from a sleep state. The L2 frame may include fields associated with the data link layer.

At step 418, the host 110 may process the L2 frame. In examples, the processing may involve a media access layer (MAC) of the host 110 receiving and processing the frame. By performing the disclosed address filtering in the RF front end 122, the host processor 110 may not need to detect whether the L2 frame is relevant frame to process, unless in some examples the host provides further consistency checking and/or additional address-filtering. Host processing resources are preserved for processing the L2 frames which are relevant and the host 110 may not need to drop L2 frames because the received L2 frames have the certain source frame address or destination frame address.

Example Apparatus

Figure 5:
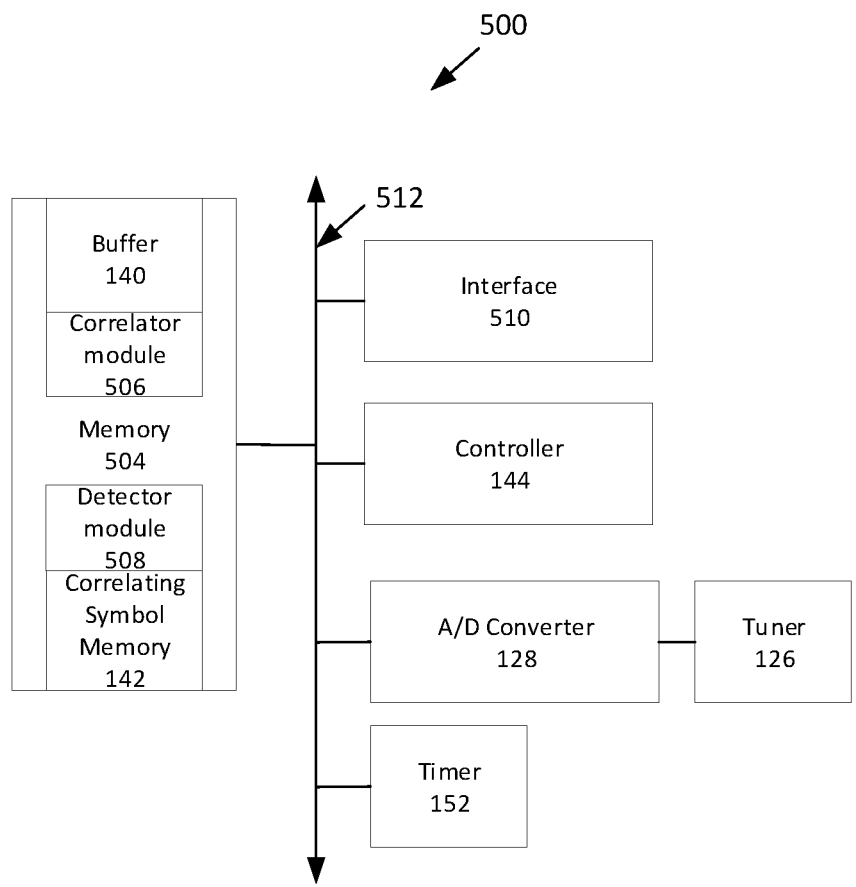
FIG. 5 is an example block diagram of the RF front end which performs the address filtering in accordance with embodiments of the invention.

FIG. 5 is an example block diagram 500 of an RF front end 122 which performs functions associated with address filtering. The RF front end 122 may have a controller 144 (possibly including a microcontroller, multiple processors, multiple cores, multiple nodes, and/or implementing multi-threading, etc.) and memory 504 such as system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more other possible realizations of non-transitory machine-readable media/medium. The memory 504 may store computer code, program instructions, computer instructions, program code associated with the correlator 136 and detector 138, shown as a correlator module 506 and a detector module 508. Additionally, the memory 504 may be partitioned into the correlating symbol memory 142 and the buffer 140. The RF front end 122 may also have a tuner 126 comprising one or more of mixers and an oscillator for mixing the RF modulated carrier wave with an RF carrier wave and an ADC 128 for generating the IQ samples of the received symbols. The interface 510 may facilitate providing received IQ samples of the received symbols to the baseband system 124 and providing the indication to wake up to the baseband system 124. The timer 152 may facilitate determining whether received symbols are associated with a source frame address or destination frame address. The processing circuity 502, memory 504, interface 510, ADC 128, and timer 152 may be communicatively coupled together via an interconnect 512 such as bus (e.g., PCI, ISA, PCI-Express).

In one embodiment, a method is disclosed. The method comprises: receiving, by an radio frequency (RF) front end of a receiver, one or more symbols of a first frame transmitted by a transmitter; determining, by the RF front end, that the one or more received symbols are correlated to one or more address symbols, wherein the one or more address symbols are each a time-domain signal of subcarriers that the transmitter transmits to cause the receiver to receive a frame address; and providing, by the RF front end, the received one or more symbols to a baseband system based on the correlation, wherein the baseband system recovers bits of a second frame within the first frame based on the received one or more symbols. In an embodiment, a plurality of orthogonal subcarriers defines the one or more address symbols and the one or more received symbols which are correlated by the RF front end. In an embodiment, the method further comprises receiving from the baseband system the one or more address symbols which are correlated with the one or more received symbols. In an embodiment, the host provides an indication of the frame address and the baseband system generates the one or more address symbols which is provided to the RF front end to be correlated with the one or more received symbols. In an embodiment, providing, by the RF front end, the one or more received symbols comprises causing the baseband system to awaken from a sleep state based on providing the received one or more received symbols to the baseband system. In an embodiment, the method further comprises measuring a time after a preamble symbol of the one or more symbols is received; and wherein correlating, by the RF front end, the one or more received symbols with one or more address symbols comprises determining that received symbols are the same as the address symbols based on the time. In an embodiment, determining that the one or more received symbols are correlated to one or more address symbols comprises correlating in-phase and quadrature phase (IQ) samples of the time domain signal of the address symbols, wherein the I sample and Q sample are in quadrature. In an embodiment, the method further comprises the baseband system demodulating IQ samples of the one or more received symbols to recover the bits of the second frame. In an embodiment, the method further comprises sending an indication to awaken the host; and providing the second frame to the host, wherein the host does not determine whether to drop the second frame.

In another embodiment, an radio reference (RF) front end of a receiver is disclosed. The RF front end comprises: a tuner implemented with circuitry configured to receive one or more symbols of a first frame transmitted by a transmitter; a correlator implemented with circuitry configured to determine a correlation between the received symbols and one or more address symbols, wherein the one or more address symbols are each a time-domain signal of subcarriers that the transmitter transmits; and a detector implemented with circuitry configured to determine that the correlation exceeds a threshold level; and cause the RF front end to provide the received one or more symbols to a baseband system based on the correlation, wherein the baseband system recovers bits of a second frame within the first frame based on the received one or more symbols. In an embodiment, the frame address is a source frame address or a destination frame address of the second frame. In an embodiment, the RF front end further comprises a correlating symbol memory implemented with circuitry configured to store the one or more address symbols which are correlated with the one or more received symbols, the one or more address symbols received from the baseband system. In an embodiment, the first frame is associated with a layer 1 frame of the open systems interconnect (OSI) model and the second frame is associated with a layer 2 frame of the OSI model. In an embodiment, one or more address symbols which are correlated with the one or more received symbols define the frame address and one or more fixed data other than the frame address. In an embodiment, the detector is further implemented with circuitry configured to cause the baseband system to awaken from a sleep state based on the correlation exceeding the threshold level.

In yet another embodiment, radio reference (RF) front end of a receiver is disclosed. The RF front end comprises: a tuner implemented with circuitry configured to receive one or more symbols of a first frame transmitted by a transmitter; wherein the first frame is associated with a layer 1 frame of the open systems interconnect (OSI) model; an analog to digital converter implemented with circuitry configured to output in-phase and quadrature phase (IQ) samples of the received one or more symbols; a correlating symbol memory implemented with circuitry configured to store IQ samples of one or more address symbols, wherein the one or more address symbols are each a time-domain signal of subcarriers that the transmitter transmits; a correlator implemented with circuitry configured to determine a correlation between IQ samples of the one or more received symbols and the IQ samples of one or more address symbols; and a detector implemented with circuitry configured to determine that the one or more received symbols are correlated with the address symbols; and cause the RF front end to provide the one or more symbols to a baseband system to recover bits of a second frame within the first frame, wherein the second frame is associated with a layer 2 frame of the OSI model. In an embodiment, the one or more address symbols which are correlated with the one or more received symbols define a source frame address or a destination frame address of the second frame. In an embodiment, the detector is further implemented with circuitry configured to cause the baseband system to awaken from a sleep state based on the determination that the one or more received symbols are correlated with the address symbols. In an embodiment, the one or more received symbols and the address symbols are each 6 bytes, modulated based on a 1/2QPSK format. In an embodiment, the detector is further implemented with circuitry configured to measure a time after a preamble symbol of the one or more symbols is received; and determine that received symbols are the address symbols based on the time.

A few implementations have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof: including potentially a program operable to cause one or more data processing apparatus such as a processor to perform the operations described (such as program code encoded in a non-transitory computer-readable medium, which can be a memory device, a storage device, a machine-readable storage substrate, or other physical, machine readable medium, or a combination of one or more of them).

While this specification contains many specifics, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations.

Use of the phrase "at least one of" preceding a list with the conjunction "and" should not be treated as an exclusive list and should not be construed as a list of categories with one item from each category, unless specifically stated otherwise. A clause that recites "at least one of A, B, and C" can be infringed with only one of the listed items, multiple of the listed items, and one or more of the items in the list and another item not listed.

Other implementations fall within the scope of the following claims.

What is claimed is:

1. A method comprising:
   receiving, by an radio frequency (RF) front end of a receiver, one or more symbols of a first frame transmitted by a transmitter;
   determining, by the RF front end, that the one or more received symbols are correlated to one or more address symbols, wherein the one or more address symbols are each a time-domain signal of subcarriers that the transmitter transmits to cause the receiver to receive a frame address; and
   providing, by the RF front end, the received one or more symbols to a baseband system based on the correlation, wherein the baseband system recovers bits of a second frame within the first frame based on the received one or more symbols.

2. The method of claim 1, wherein a plurality of orthogonal subcarriers defines the one or more address symbols and the one or more received symbols which are correlated by the RF front end.

3. The method of claim 1, further comprising receiving from the baseband system the one or more address symbols which are correlated with the one or more received symbols.

4. The method of claim 3, wherein the host provides an indication of the frame address and the baseband system generates the one or more address symbols which is provided to the RF front end to be correlated with the one or more received symbols.

5. The method of claim 1, wherein providing, by the RF front end, the one or more received symbols comprises causing the baseband system to awaken from a sleep state based on providing the received one or more received symbols to the baseband system.

6. The method of claim 1, further comprising measuring a time after a preamble symbol of the one or more symbols is received; and wherein correlating, by the RF front end, the one or more received symbols with one or more address symbols comprises determining that received symbols are the same as the address symbols based on the time.

7. The method of claim 1, wherein determining that the one or more received symbols are correlated to one or more address symbols comprises correlating in-phase and quadrature phase (IQ) samples of the time domain signal of the address symbols, wherein the I sample and Q sample are in quadrature.

8. The method of claim 1, further comprising the baseband system demodulating in-phase and quadrature-phase (IQ) samples of the one or more received symbols to recover the bits of the second frame.

9. The method of claim 1, further comprising sending an indication to awaken the host; and providing the second frame to the host, wherein the host does not determine whether to drop the second frame.

10. A radio reference (RF) front end of a receiver, the RF front end comprising:
    a tuner implemented with circuitry configured to receive one or more symbols of a first frame transmitted by a transmitter;
    a correlator implemented with circuitry configured to determine a correlation between the received symbols and one or more address symbols, wherein the one or more address symbols are each a time-domain signal of subcarriers that the transmitter transmits; and
    a detector implemented with circuitry configured to determine that the correlation exceeds a threshold level; and cause the RF front end to provide the received one or more symbols to a baseband system based on the correlation, wherein the baseband system recovers bits of a second frame within the first frame based on the received one or more symbols.

11. The RF front end of claim 10, wherein the frame address is a source frame address or a destination frame address of the second frame.

12. The RF front end of claim 10, further comprising a correlating symbol memory implemented with circuitry configured to store the one or more address symbols which are correlated with the one or more received symbols, the one or more address symbols received from the baseband system.

13. The RF front end of claim 10, wherein the first frame is associated with a layer 1 frame of the open systems interconnect (OSI) model and the second frame is associated with a layer 2 frame of the OSI model.

14. The RF front end of claim 10, wherein one or more address symbols which are correlated with the one or more received symbols define the frame address and one or more fixed data other than the frame address.

15. The RF front end of claim 10, wherein the detector is further implemented with circuitry configured to cause the baseband system to awaken from a sleep state based on the correlation exceeding the threshold level.

16. A radio reference (RF) front end of a receiver, the RF front end comprising:
    a tuner implemented with circuitry configured to receive one or more symbols of a first frame transmitted by a transmitter; wherein the first frame is associated with a layer 1 frame of the open systems interconnect (OSI) model;
    an analog to digital converter implemented with circuitry configured to output in-phase and quadrature phase (IQ) samples of the received one or more symbols;
    a correlating symbol memory implemented with circuitry configured to store IQ samples of one or more address symbols, wherein the one or more address symbols are each a time-domain signal of subcarriers that the transmitter transmits;
    a correlator implemented with circuitry configured to determine a correlation between IQ samples of the one or more received symbols and the IQ samples of one or more address symbols; and
    a detector implemented with circuitry configured to determine that the one or more received symbols are correlated with the address symbols; and cause the RF front end to provide the one or more symbols to a baseband system to recover bits of a second frame within the first frame, wherein the second frame is associated with a layer 2 frame of the OSI model.

17. The system of claim 16, wherein the one or more address symbols which are correlated with the one or more received symbols define a source frame address or a destination frame address of the second frame.

18. The system of claim 16, wherein the detector is further implemented with circuitry configured to cause the baseband system to awaken from a sleep state based on the determination that the one or more received symbols are correlated with the address symbols.

19. The system of claim 16, wherein the one or more received symbols and the address symbols are each 6 bytes, modulated based on a 1/2 quadrature phase shift keying (QPSK) format.

20. The system of claim 16, wherein the detector is further implemented with circuitry configured to measure a time after a preamble symbol of the one or more symbols is received; and determine that received symbols are the address symbols based on the time.

* * * * *